United States Patent [19]

Tamoto et al.

[11] Patent Number: 4,587,200
[45] Date of Patent: May 6, 1986

[54] PHOTOPOLYMERIZABLE COMPOSITION COMPRISING AN ACRIDINE AND A HETEROCYCLIC THIOL COMPOUND AS A PHOTOPOLYMERIZATION INITIATOR AND A PHOTOGRAPHIC PROCESS USING SAID PHOTOPOLYMERIZABLE COMPOSITION

[75] Inventors: Koji Tamoto; Akira Umehara, both of Kanagawa, Japan

[73] Assignee: Fuji Photo Film Co., Ltd., Kanagawa, Japan

[21] Appl. No.: 617,436

[22] Filed: Jun. 5, 1984

[30] Foreign Application Priority Data

Jun. 6, 1983 [JP] Japan ................... 58-100500

[51] Int. Cl.$^4$ .................... C08F 2/46; C08F 4/00; G03C 1/68
[52] U.S. Cl. .................... 430/281; 430/920; 430/921; 430/922; 430/926; 522/26; 522/51; 522/63; 522/182
[58] Field of Search ........... 430/920, 921, 922, 281, 430/926; 204/159.24

[56] References Cited

U.S. PATENT DOCUMENTS

| | | | |
|---|---|---|---|
| 2,773,822 | 12/1956 | Kern | 204/159.24 |
| 3,751,259 | 8/1973 | Bauer et al. | 430/288 |
| 3,882,168 | 5/1975 | Klupfel et al. | 430/526 X |
| 3,933,682 | 1/1976 | Bean | 204/159.24 |
| 3,966,573 | 6/1976 | Bean | 204/159.24 |
| 4,001,017 | 1/1977 | Baumann et al. | 204/159.24 |
| 4,019,972 | 4/1977 | Faust | 430/287 X |
| 4,250,248 | 2/1980 | Faust | 430/905 X |

*Primary Examiner*—John E. Kittle
*Assistant Examiner*—Cynthia Hamilton
*Attorney, Agent, or Firm*—Sughrue, Mion, Zinn, Macpeak and Seas

[57] ABSTRACT

A photopolymerizable composition is disclosed, comprising a polymerizable compound having at least one ethylenic unsaturated double bond and a photopolymerization initiator, where the photopolymerization initiator is a combination of (A) acridine having a substituted or unsubstituted phenyl group at 9-position and (B) a heterocyclic compound having a thiol group connected to a 5- to 7-membered heterocyclic ring containing at least one nitrogen atom. The photopolymermizable composition is useful for preparation of lithographic plates and photoresists and as an adhesive, printing ink or coating material.

13 Claims, No Drawings

PHOTOPOLYMERIZABLE COMPOSITION COMPRISING AN ACRIDINE AND A HETEROCYCLIC THIOL COMPOUND AS A PHOTOPOLYMERIZATION INITIATOR AND A PHOTOGRAPHIC PROCESS USING SAID PHOTOPOLYMERIZABLE COMPOSITION

FIELD OF THE INVENTION

The present invention relates to a photopolymerizable composition. More particularly, it relates to a photopolymerizable composition which includes a photopolymerization initiator.

BACKGROUND OF THE INVENTION

It is known that the compositions of coating materials, printing ink, adhesives, and the like may contain as one component thereof an unsaturated compound which cures on irradiation. Such a compound in the composition polymerizes to cure when the composition is irradiated with electromagnetic waves such as visible rays, ultraviolet rays, and X-rays, or particle rays such as electron rays, neutron rays, and alpha rays. The rate of polymerization is extremely increased when the irradiation is performed in the presence of a composition of polymerization initiator. These technologies are disclosed in U.S. Pat. No. 3,551,235, 3,551,246, 3,551,311 and 3,558,387, Belgian Patent No. 808,179, and Japanese Patent Application (OPI) No. 110781/74 (the term "OPI" as used herein refers to a "published unexamined Japanese patent application"). These technologies provide products which have superior flexibility, chemical resistance, antiabrasion, gloss, adhesion and hue. On the other hand, they have some problems. That is, the sensitivity of the composition is so low that image formation requires a long exposure time. The longer the exposure time, the greater the chance that the apparatus will be moved. Even the slightest movement can deteriorate the quality of the image. If the energy of the light source or particle-ray source is increased to compensate for the low sensitivity, a secondary problem of heat occurs. The coating film of the composition might be deformed or degraded by this heat. Extensive research has been conducted to overcome the above-mentioned disadvantages by increasing the sensitivity of the photopolymerizable composition.

There is disclosed in Japanese Patent Application (OPI) No. 4126/72 a photopolymerizable composition containing an acridine or phenazine compound as a photopolymerization initiator. Although 9-phenylacridine, 9-p-tolylacridine, and 9-acetylaminoacridine are disclosed as having high sensitivity, this publication teaches that their sensitivity is not yet satisfactory. U.S. Pat. No. 3,479,185 teaches that 2-mercaptobenzimidazole, 2-mercaptobenzooxazole, and 2-mercaptosuccinic acid are useful as a free-radical generator in a photopolymerizable composition containing 2,4,5-triphenylimidazole dimer composed of two lophine residues. It was found, however, that the mercapto compound alone is not useful as a photopolymerization initiator of the photopolymerizable composition.

SUMMARY OF THE INVENTION

As the result of their extensive research, the present inventors have discovered that a highly sensitive photopolymerizable composition can be obtained by combining as a photopolymerization initiator,(A) an acridine having a substituted or unsubstituted phenyl group at 9-position (abbreviated as a 9-phenylacridine hereinafter) with (B) a heterocyclic compound (referred to as a mercapto compound hereinafter) having a thiol group (or a mercapto group) connected to a 5- to 7-membered heterocyclic ring containing at least one nitrogen atom. The present invention was completed based on this finding.

An object of the invention is to provide a highly sensitive photopolymerization initiator and a photopolymerization initiator system which are used for a photopolymerizable composition containing photosensitive polymers, such as a photoresist.

Another object of the invention is to provide a photopolymerization initiator and photopolymerization initiator system which increase the rate of photopolymerization of a photopolymerizable composition containing a polymerizable compound having an ethylenic unsaturated double bond.

Other and further objects, features and advantages of this invention will appear more fully from the following description.

The objects of the invention are achieved with a photopolymerizable composition which contains as essential constituents (1) a polymerizable compound (referred to as an ethylenic compound hereinafter) having at least one ethylenic unsaturated double bond in the molecule, and (2) a photopolymerization initiator, wherein the photopolymerization initiator is composed of at least (A) an acridine compound having a substituted or unsubstituted phenyl group at 9-position and (B) a heterocyclic compound having a thiol group connected to a 5- to 7-membered heterocyclic ring containing at least one nitrogen atom.

The substituent group on the phenyl group of the 9-phenylacridine compound is a substituted or unsubstituted alkyl group having 1 to 5 carbon atoms, a substituted or unsubstituted alkoxyl group having 1 to 5 carbon atoms, an acyl group having 1 to 5 carbon atoms, a dialkylamino group composed of alkyl groups having 1 to 5 carbon atoms, a cyano group, or a halogen atom.

The heterocyclic ring of the heterocyclic thiol compound is composed of 5- to 7-members containing at least one nitrogen atom; and the heterocyclic ring may be fused with the other aromatic ring.

DETAILED DESCRIPTION OF THE INVENTION

The invention will now be described in detail.

The ethylenic compound in the photopolymerizable composition of this invention is a compound having at least one ethylenic unsaturated double bond in the molecule. It may be in the chemical form of monomer, prepolymer such as dimer and trimer, and other oligomers, and a mixture thereof, and a copolymer thereof. It includes, for example, unsaturated carboxylic acids and the salts thereof and the esters thereof with an aliphatic polyol.

Examples of the unsaturated carboxylic acids include acrylic acid, methacrylic acid, itaconic acid, crotonic acid, isocrotonic acid, and maleic acid. The salts of the unsaturated carboxylic acids include sodium salts and potassium salts of the foregoing unsaturated carboxylic acids.

Examples of the aliphatic polyols include ethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, pentaerythritol, dipentaerythritol, tripentaerythritol, the other polymeric pentaerythritols, sorbitol, d-mannitol, and dihydroxymaleic acid.

Examples of the esters of the unsaturated carboxylic acids and the aliphatic polyols include acrylic esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate, and oligomers thereof; methacrylic esters such as tetramethylene glycol dimethacrylate, triethylene glycol dimethacrylate, pentaerythritol dimethacrylate, pentaerythritol trimethacrylate, dipentaerythritol dimethacrylate, dipentaerythritol tetramethacrylate, pentaerythritol octamethacrylate, ethylene glycol dimethacrylate, 1,3-butanediol dimethacrylate, and sorbitol tetramethacrylate; itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, dipentaerythritol triitaconate, dipentaerythritol pentaitaconate, dipentaerythritol hexaitaconate, and sorbitol tetraitaconate; crotonic esters such as ethylene glycol dicrotonate, propylene glycol dicrotonate, tetramethylene glycol dicrotonate, pentaerythritol dicrotonate, and sorbitol tetracrotonate; isocrotonic esters such as ethylene glycol diisocrotonate, pentaerythritol diisocrotonate, and sorbitol tetraisocrotonate; maleic esters such as ethylene glycol dimaleate, triethylene glycol dimaleate, pentaerythritol dimaleate, and sorbitol tetramaleate; and other esters such as modified tetramethylene glycol diacrylate, modified trimethylol propane triacrylate, modified pentaerythritol triacrylate, methacrylated epoxy resin, and mixtures of the foregoing esters. Preferred examples of the esters include trimethylolpropane triacrylate, trimethylolethane triacrylate, pentaerythritol diacrylate, pentaerythritol triacrylate, pentaerythritol tetraacrylate, pentaerythritol dimethacrylate and pentaerythritol trimethacrylate. Particularly preferred examples of the esters include trimethylolethane triacrylate, trimethylolpropane triacrylate, pentaerythritol triacrylate and pentaerythritol tetraacrylate.

The polymerization initiator which plays an important role in the photopolymerizable composition of this invention is described below.

Examples of 9-phenylacridine compounds include ethylphenyl)acridine, 9-(p-n-propylphenyl)acridine, 9-(p-isopropylphenyl)acridine, 9-(p-n-butylphenyl)acridine, 9-(p-tert-butylphenyl)acridine, 9-(p-methoxyphenyl)acridine, 9-(p-ethoxyphenyl)acridine, 9-(p-acetylphenyl)acridine, 9-(p-dimethylaminophenyl)acridine, 9-(pdiethylaminophenyl)acridine, 9-(p-cyanophenyl)acridine, 9-(p-chlorophenyl)acridine, 9-(p-bromophenyl)acridine, 9-(m-methylphenyl)acridine, 9-(m-ethylphenyl)acridine, 9-(m-n-propylphenyl)acridine, 9-(m-isopropylphenyl)acridine, 9-(m-n-butylphenyl)acridine, 9-(m-tert-butylphenyl)acridine, 9-(m-methoxyphenyl)acridine, 9-(methoxyphenyl)acridine, 9-(m-acetylphenyl)acridine, 9-(mdimethylaminophenyl)acridine, 9-(m-diethylaminophenyl)acridine, 9-(m-cyanophenyl)acridine, 9-(m-chlorophenyl)acridine, and 9-(m-bromophenyl)acridine.

Among these compounds, 9-phenylacridine, 9-(p-tert-butylphenyl)acridine, 9-(p-methylphenyl)acridine, 9-(p-chlorophenyl)acridine, and 9-(p-bromophenyl)acridine are preferable from the standpoint of increased sensitivity, miscibility with the photopolymerizable composition, storage stability, and the strength of the image formed.

The heterocyclic thiol compound includes 2mercaptoimidazole, 2-mercaptooxazole, 2-mercaptothiazole, 3-mercapto-1,2,4-triazole, 2-mercaptobenzoxazole, 2-mercaptobenzothiazole, 2-mercaptooxadiazole, 5-methylmercapto-2-mercaptooxadiazole, 5-methylmercapto-2-mercaptothiazole, 5-mercapto-1-phenyltetrazole, 6-chloro-2-mercaptobenzimidazole, 6-chloro-2mercaptobenzothiazole, 6-methoxy-2-mercaptobenzimidazole, 6-methoxy-2-mercaptobenzoxazole, 6-methoxy-2-mercaptobenzothiazole, 6-phenyl-2-mercaptobenzimidazole, 6-phenyl-2-mercaptobenzoxazole, 6-phenyl-2-mercaptobenzothiazole, 2-mercaptonaphthoimidazole, 2-mercaptonaphthoxazole, and 2-mercaptonaphthothiazole.

Preferable among these compounds are 2-mercaptobenzimidazole, 2-mercaptobenzoxazole, 2-mercaptobenzothiazole, 3-mercapto-1,2,4-triazole, and 5-mercapto1-phenyltetrazole.

In the photopolymerizable composition of this invention, the photopolymerization initiator is contained in an amount of 1 part by weight for 5 to 1,000 parts by weight of the ethylenic compound. The preferred weight ratio is about 1:10 to 1:100. The particularly preferred weight ratio is about 1:10 to 1:20. In the photopolymerization initiator, the ratio by weight of component (A) to component (B) is about 30:1 to 1:30, preferably about 10:1 to 1:10, and particularly preferably about 2:1 to 1:2.

The photopolymerizable composition of this invention which contains the above-mentioned ethylenic compound and photopolymerization initiator may further contain known additives such as a binder, a heat-polymerization inhibitor, a plasticizer, a coloring agent, and a surface smoothing agent as modifiers.

The photopolymerizable composition may be combined with a film-forming polymeric substance (binder) that forms a resist (thick) image on the photosensitive material in the case where the photosensitive material undergoes peel-off development (as mentioned later) or liquid development. Such a polymeric substance may be any organic polymer which is miscible with the polymerizable compound having an ethylenic unsaturated double bond. Preferred polymers are those which permit peel-off development or development with water or weak alkaline aqueous solution. In addition, the polymer used as the film former should have an affinity for water, weak alkaline aqueous solutions, or organic solvent used as a developing solution. For example, a water-soluble polymer will permit the development with water. Examples of such a polymer include addition polymers having a carboxyl group in the side chain such as methacrylic acid copolymers, acrylic acid copolymers, itaconic acid copolymers, partially esterified maleic acid copolymers, maleic acid copolymers, and crotonic acid copolymers; acid cellulose derivatives having a carboxyl group in the side chain; addition polymers having a hydroxyl group obtained by addition of cyclic acid anhydride; and polyvinylpyrrolidone and polyethylene oxide. Moreover, alcohol-soluble nylon and a polyether composed of 2,2bis(4-hydroxyphenyl)-propane and epichlorohydrin are useful to strengthen that part of the film which has been cured after exposure.

The above-mentioned organic polymer may be added in any amount within 90 wt % in the composition. The organic polymer in an excess amount will adversely affect the strength of the image. The linear polymer used for peel-off development is not limited, and may include chlorinated polyolefins (e.g., chlorinated polyethylene and chlorinated polypropylene), polymethyl methacrylate, polyacrylic acid, polymethacrylic acid, polyalkyl acrylate esters (alkyl: methyl, ethyl, butyl, etc.), copolymers of alkyl acrylate ester (same alkyl as above) and at least one monomer of acrylonitrile, vinyl chloride, vinylidene chloride, styrene, and butadiene; polyvinyl chloride, vinyl chloride-acrylonitrile copolymer, polyvinylidene chloride, vinylidene chloride-acrylonitrile copolymer, polyvinyl acetate, vinyl acetatevinyl chloride copolymer, polyvinyl alcohol, polyvinyl pyrrolidone, polyacrylonitrile, acrylonitrile-styrene copolymer, acrylonitrile-butadiene-styrene copolymer, polyvinyl alkyl ether (alkyl: methyl, ethyl, isopropyl, butyl, etc.), polymethyl vinyl ketone, polyethyl vinyl ketone, polyethylene, polypropylene, polybutylene, polystyrene, poly-α-methylstyrene, polyamide (6-nylon, 6,6-nylon, etc.), poly-1,3-butadiene, polyisoprene, polyurethane, polyethylene terephthalate, polyethylene isophthalate, chlorinated rubber, polychloroprene, ethylcellulose, acetylcellulose, polyvinyl butyral, polyvinylformal, styrene-butadiene rubber, and poly(chlorosulfonated ethylene). The above-mentioned copolymers may contain the monomers in any broad ratio; but the minor monomer should preferably be 10 to 50% by weight. Other thermoplastic polymers than mentioned above may be used so long as they meet the above-mentioned conditions.

These polymers may be used alone or in combination with among others in a proper ratio where they are compatible with among others.

The heat polymerization inhibitor is not limited, and may include p-methoxyphenol, hydroquinone, alkyl- or aryl-substituted hydroquinone, t-butylcatechol, pyrogallol, cuprous chloride, phenothiazine, chloranil, naphthylamine, β-naphthol, 2,6-di-t-butyl-p-cresol, pyridine, nitrobenzene, dinitrobenzene, p-toluidine, and organic copper salts such as copper acetate. The content of the inhibitor should preferably be 0.001 to 5 parts by weight for 100 parts by weight of the above-mentioned ethylenic compound. The inhibitor is added to improve the storage stability prior to exposure of the composition of this invention.

Any coloring agent known in the art may be added to the photopolymerizable composition of the invention as desired. Examples of the coloring agent include titanium oxide, carbon black, iron oxide, phthalocyanine pigment, azo pigment, and other pigments; and methylene blue, crystal violet, rhodamine B, fucshine, auramine, azo dyes, anthraquinone dyes, and other dyes. Preferred coloring agents are those which do not absorb the light of specific wavelength which activates the photopolymerization initiator. The content of the pigment should be 0.1 to 30 parts by weight and the content of the dye should be 0.01 to 10 parts by weight, preferably 0.1 to 3 parts by weight, for 100 parts by weight of the total weight of the binder and ethylenic compound. The coloring agent is preferably used in combination with an adjuvant such as dichloromethyl stearate and other chlorinated fatty acid, in an amount of 0.005 to 0.5 part by weight for 1 part by weight of coloring agent. The adjuvant for coloring agent functions as diffusion-solubilization agents. The adjuvant for coloring agent is not required where the photopolymerizable composition contains a plasticizer.

The plasticizer used is not limited, and may be freely selected from known conventional plasticizers. Examples of the plasticizer include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butylbenzyl phthalate, diisodecyl phthalate, and diallyl phthalate; glycol esters such as triethylene glycol caprylate; phosphoric esters such as tricresyl phosphate and triphenyl phosphate; esters of aliphatic dibasic acids such as diisobutyl adipate, dioctyl adipate, dimethyl sebacate, dibutyl sebacate, dioctyl sebacate, and dibutyl maleate; and triethyl citrate, glycerol triacetyl ester, and butyl laurate.

Surface smoothing agents known in the art may also be added to the photopolymerizable composition of the invention without limitation. Typical surface smoothing agents include lanolin, paraffin, and natural wax.

The above-mentioned modifiers may be added in an amount up to 3 wt %, and preferably up to 1 wt %, based on the total weight of the photopolymerizable composition of this invention.

In most cases, the photopolymerizable composition of this invention is dissolved in an appropriate solvent, and the resulting solution is applied to a substrate according to the conventional method and the solvent is removed. The film thus formed is used as a photopolymerizable photosensitive material.

Examples of the solvent include acetone, methyl ethyl ketone, methyl isobutyl ketone, cyclohexanone, diisobutyl ketone, and other ketones; ethyl acetate, butyl acetate, n-amyl acetate, methyl formate, ethyl propionate, dimethyl phthalate, ethyl benzoate, and other esters; toluene, xylene, benzene, ethyl benzene, and other aromatic hydrocarbons; carbon tetrachloride, trichloroethylene, chloroform, 1,1,1-trichloroethane, monochlorobenzene, chloronaphthalene, and other halogenated hydrocarbons; tetrahydrofuran, diethyl ether, ethylene glycol monomethyl ether, ethylene glycol monoethyl ether acetate, and other ethers; and dimethylformamide and dimethyl sulfoxide.

The photopolymerizable composition of this invention may be applied in the solution form or in any other forms to a flat substrate or the other substrate which is dimensionally stable. Examples of flat substrates include glass, silicon oxide, ceramics, paper, metals (e.g., aluminum, zinc, magnesium, copper, iron, chromium, nickel, silver, gold, platinum, palladium, aluminum base alloys, zinc base alloys, magnesium base alloys, copper-zinc alloys, iron-nickel-chromium alloys, and copper base alloys), metal oxides (e.g., aluminum oxide, tin oxide ($SnO_2$) and indium oxide ($In_2O_3$)), polymers (e.g., regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonate of bisphenol A, polyethylene, polypropylene, nylons (6-nylon, 6,6-nylon, 6,10-nylon, etc.), polyvinyl chloride, vinyl chloride-vinyl acetate copolymer, vinyl chloride-acrylonitrile copolymer, vinyl chloride-vinylidene chloride copolymer, polyacrylonitrile, methyl polyacrylate, and methyl polymethacrylate. The above-mentioned flat substrates may be used in the form of a laminate which is prepared by firmly adhering at least two thin plates as described above, such as cermet, iron-aluminum laminate, iron-copper-aluminum laminate, iron-chromium-copper laminate, polyethylene-coated paper, cellulose triacetate-coated paper, anodized aluminum plate having a surface layer of aluminum oxide, chromium plate having a surface layer of chromium oxide, glass plate having a surface layer of tin oxide, and silicon oxide plate having a surface layer of indium oxide.

The substrate may be transparent or opaque depending on the intended use of the photosensitive image-forming material. The transparent substrate may be colored with a dye or pigment as described in *Journal of the Society of Motion Picture and Television Engineers* Vol. 67, p. 296 (1958). The opaque substrate may be made of paper or metal which is inherently opaque or made of any transparent material incorporated with a dye or pigment like titanium oxide. In addition, the opaque substrate includes a plastic film which has undergone surface treatment according to the method described in Japanese Patent Publication No. 19068/72, and paper and plastic films which are made completely opaqye by incorporating therein carbon black and the like. The substrate may be provided on the surface thereof with minute irregularities by sanding, electrolytic etching, anodization, or chemical etching. In addition, the substrate may undergo surface treatment such as corona discharge, UV light irradiation, and flame treatment. The plastic substrate may be reinforced with glass fibers, carbon fibers, boron fibers, metal fibers, metal wiskers, and the like.

The substrate may be provided on the surface thereof with a prime coat, antihalation coating, UV absorbing layer, and/or visible light absorbing layer.

In order to prevent the photopolymerizable composition of this invention from decreasing in sensitivity on account of oxygen, exposure is carried out with a vacuum printing frame placed on the sensitive layer as disclosed in U.S. Pat. No. 3,060,026, or with a removable transparent cover placed on the sensitive layer, or with an oxygen-impervious coating layer placed on the sensitive layer as disclosed in Japanese Patent Publication No. 17828/65.

The curing rate of the photopolymerizable composition of this invention is determined by the substrate, namely, the surface properties of the substrate, the quantity of the photopolymerization initiator, the thickness of the layer of the photopolymerizable composition, the properties (spectrum) of the light source, the intensity of light, the presence or absence of oxygen, and the ambient temperature.

The exposure may be carried out by any conventional method used individually or in combination. The type of the light source for exposure is not restricted so long as an effective exposure is given, because the photopolymerizable composition of this invention has the maximum sensitivity in the spectral range from ultraviolet light to visible light, or from about 180 nm to 600 nm in wavelength. In addition, the composition of this invention is also sensitive to electromagnetic waves of short wavelengths such as vacuum ultraviolet rays, X-rays, and gamma-rays and particle rays such as electron rays, neutron rays, and alpha-rays. Thus, they can also be utilized for image exposure. The proper light sources for ultraviolet light and visible light are not restricted, and include a carbon arc lamp, mercury vapor lamp, xenon lamp, fluorescent lamp, argon glow discharge lamp, photographic flood lamp, and laser.

The irradiation may be for any period long enough to provide a sufficient exposure. The irradiation may be carried out at any temperature; but most suitably at 10° C. to 40° C. for practical reasons. When cured by light, the composition of this invention becomes a dry, resilient material which is resistant to wear and chemicals, and exhibits good ink receptivity, proper hydrophilic-hydrophobic balance, anti-staining property, and initial roll-up performance. It is applicable particularly to the presensitized plate for lithography and the photoresist. Also, the composition of this invention is useful as a printing ink; an adhesive for metal foil, film, paper, and fabrics; and as a photocurable paint for metal, plastics, paper, wood, metal foil, fabrics, glass, paperboard, paperboard for box making, and signs on the road, parking lot, and airport.

The composition of this invention used as the vehicle of printing ink may be colored with the known organic pigments in addition to the known amount of dyes, for example, molybdate orange, titanium white, chromium yellow, phthalocyanine blue, and carbon black. The quantity of the vehicle is about 20 to 99.9% of the total weight of the composition, and the quantity of the coloring agent is about 0.1 to 80%. The printing ink can be applied to paper, clay-coated paper, and paperboard for box making.

In addition, the composition of this invention can be used as the vehicle of the printing ink for cloth of natural fiber or synthetic fiber and as the vehicle of the agent to impart water repellency, oil resistance, soil resistance, and crease resistance to fabrics.

Where the composition of this invention is used as an adhesive, at least one of the adherends has to be translucent to ultraviolet light or visible light. It can be used to make laminates by bonding adherends such as polypropylene and cellophane, aluminum or copper and polyethylene terephthalate, and aluminum and polypropylene.

The photopolymerizable composition of this invention can be applied, in the form of coating material, to metal, glass, or plastics by rolling or spraying. Those materials that can be coated with the colored composition include glass, polyester film, vinyl polymer film, polymer-coated cellophane, treated or untreated polyethylene and polypropylene for disposable cups and bottles, and sized or unsized tinplate.

The sensitive image-forming material made of the composition of this invention is exposed to light for a period of time long enough for the exposed part of the composition to undergo addition polymerization as thick as desired. The unexposed part of the layer of the composition is removed by using a solvent that dissolves the ethylenic compound (monomer) or prepolymer but does not dissolve the polymer, or by the so-called peel-off development. After the solvent has been removed (dried), the photocured composition should be 2 to 150 $\mu$m thick, and preferably 3 to 100 $\mu$m thick. The thicker the layer, the less the flexibility; and the thinner the layer, the less the wear resistance.

The photopolymerizable compositions of the invention can be used as printing ink, coating material, and adhesive without any volatile solvent. They have many advantages over the conventional oil-containing resin type and solvent type ink and coating materials.

The invention is described in greater detail with reference to the following examples, although the scope of the invention is not limited thereto. Unless otherwise indicated herein, all percents, parts and ratios are by weight.

EXAMPLE 1

A photopolymerizable composition was prepared by mixing the following components at room temperature for 30 minutes using a magnetic stirrer.

|  | Unit: parts by weight |
|---|---|
| Pentaerythritol Tetraacrylate | 4.9 |
| Oil Blue | 0.2 |
| Behenic Acid | 0.2 |
| Photopolymerization Initiator (Table 1) | 0.3 |
| Benzyl Methacrylate-Methacrylic Acid Copolymer (73:27 weight ratio) (with an intrinsic viscosity of 0.12 as measured in MEK at 30° C.) | 3.6 |
| Methyl Ethyl Ketone | 45 |
| Ethylene Glycol Monomethyl Ether Acetate | 45 |

The type and quantity of the photopolymerization initiator are shown in Table 1. The resulting composition was applied to an aluminum plate by using a whirler (a rotary coater), followed by drying at 100° C. for 5 minutes. Thus Samples 1 to 11 were produced, each having a sensitive layer about 2 μm thick.

The sensitive layer was exposed to a light source (superhigh pressure mercury vapor lamp, 2 kw) placed 50 cm away, for 10 seconds, with a 0.15 step wedge on the sensitive layer. The sensitive layer was treated with a developing solution of the following composition at 20° C. for 30 seconds by which the unexposed portion of the sensitive layer was dissolved.

|  | Unit: parts by weight |
|---|---|
| Trisodium Phosphate | 25 |
| Monosodium Phosphate | 5 |
| Butyl Cellosolve | 70 |
| Polyoxyethylene Octylphenyl Ether | 2 |
| Water | 1,000 |

The highest step of the wedge under which the sensitive layer remained undissolved was regarded as the sensitivity. The results are shown in Table 1. The higher the step, the higher the sensitivity.

It is to be noted in Table 1 that high sensitivity was achieved in Samples 1 to 5 in which 9-phenylacridine and a heterocyclic thiol compound are combined as the photopolymerization initiator of this invention, and that sensitivity was low in Samples 6 to 11 in which the two compounds were used individually.

EXAMPLE 2

The sensitive layer of Samples 1 to 5 obtained in Example 1 was further coated with the following composition by using a whirler, followed by drying at 50° C. for 5 minutes. The resulting coating layer was about 1 μm thick.

|  | Unit: parts by weight |
|---|---|
| Polyvinyl Alcohol* | 3.5 |
| "Anon LG"** | 0.25 |
| "Anon BF"** | 0.25 |
| Water | 966 |

*"Gosenol", degree of polymerization: 500, a product of Nippon Synthetic Chemical Industry Co., Ltd.
**A product of Nippon Oils & Fats Co., Ltd.

Samples 12 to 16 thus obtained were exposed and developed in the same way as in Example 1. After the coated layer and the unexposed part of the sensitive layer had been removed by the same method described in Example 1, the image of the stepped wedge was obtained.

Table 1 shows the type of photopolymerization initiators used and the sensitivity of the sensitive layer obtained. It is to be noted in Table 1 that a high sensitivity was obtained in Samples 12 to 16 each having the coating layer. This demonstrates that good results are obtained by combining the photopolymerization initiators as specified in this invention.

TABLE 1

| Sample No. | Photopolymerization Initiator | | | | Total Quantity of Photopolymerization Initiator (pt. by weight) | Sensitivity (step of wedge) |
|---|---|---|---|---|---|---|
|  | 9-Phenylacridine | Quantity Added pt. by) weight) | Heterocyclic Thiol Compound | Quantity Added (pt. by weight) |  |  |
| 1 (Example) | 9-phenylacridine | 0.18 | 2-mercaptoimidazole | 0.12 | 0.3 | 14 |
| 2 (Example) | 9-phenylacridine | 0.18 | 2-mercaptooxazole | 0.12 | 0.3 | 14 |
| 3 (Example) | 9-phenylacridine | 0.18 | 2-mercaptothiazole | 0.12 | 0.3 | 13 |
| 4 (Example) | 9-(p-t-butylphenyl)acridine | 0.18 | 2-mercaptoimidazole | 0.12 | 0.3 | 16 |
| 5 (Example) | 9-(p-chlorophenyl)acridine | 0.18 | 2-mercaptoimidazole | 0.12 | 0.3 | 14 |
| 6 (Comp. Ex.) | — | — | 2-mercaptoimidazole | 0.3 | 0.3 | 0 |
| 7 (Comp. Ex.) | — | — | 2-mercaptooxazole | 0.3 | 0.3 | 0 |
| 8 (Comp. Ex.) | — | — | 2-mercaptothiazole | 0.3 | 0.3 | 0 |
| 9 (Comp. Ex.) | 9-phenylacridine | 0.3 | — | — | 0.3 | 9 |
| 10 (Comp. Ex.) | 9-(p-t-butylphenyl)acridine | 0.3 | — | — | 0.3 | 9 |
| 11 (Comp. Ex.) | 9-(p-chlorophenyl)acridine | 0.3 | — | — | 0.3 | 9 |
| 12 (Example) | 9-phenylacridine | 0.18 | 2-mercaptoimidazole | 0.12 | 0.3 | 15 |
| 13 (Example) | 9-phenylacridine | 0.18 | 2-mercaptooxazole | 0.12 | 0.3 | 15 |
| 14 (Example) | 9-phenylacridine | 0.18 | 2-mercaptothiazole | 0.12 | 0.3 | 14 |
| 15 (Example) | 9-(p-t-butylphenyl)acridine | 0.18 | 2-mercaptoimidazole | 0.12 | 0.3 | 17 |
| 16 (Example) | 9-(p-chlorophenyl)acridine | 0.18 | 2-mercaptoimidazole | 0.12 | 0.3 | 15 |

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising (1) a polymerizable compound having at least one ethylenic unsaturated double bond and (2) a photopolymerization initiator, said photopolymerization initiator being present in an amount of 1:5 to 1:1,000 parts by weight of said polymerizable compound having at lest one ethylenic unsaturated double bond and comprising (A) an acridine having a substituted or unsubstituted phenyl group at the 9-position and (B) a heterocyclic thiol compound having a 5- to 7-membered heterocyclic ring containing at least one nitrogen atom with the weight ratio of said acridine compound to said heterocyclic compound being from about 30:1 to 1:30.

2. The photopolymerizable composition claimed in claim 1, wherein the polymerizable compound having at least one ethylenic unsaturated double bond in the molecule is selected from the group consisting of unsaturated carboxylic acids, salts of unsaturated carboxylic acids and esters of unsaturated carboxylic acids with an aliphatic polyol.

3. The photopolymerizable composition claimed in claim 2, wherein the unsaturated carboxylic acid is selected from the group consisting of acrylic acid, methacrylic acid, itaconic acid, crotonic acid, isocrotonic acid, and maleic acid; the salt of said unsaturated carboxylic acids is selected from the group consisting of sodium and potassium salts of the foregoing unsaturated carboxylic acids; and the esters of said unsaturated carboxylic acids are esters of the foregoing unsaturated carboxylic acids with an aliphatic polyol selected from the group consisting of ethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, pentaerythritol, dipentaerythritol, tripentaerythritol, polymeric pentaerythritol, sorbitol, d-mannitol and dihydroxymaleic acid.

4. The photopolymerizable composition claimed in claim 3, wherein said ester of an unsaturated carboxylic acid with an aliphatic polyol is selected from the group consisting of ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate, oligomers of the acrylates, tetramethylene glycol dimethacrylate, triethylene glycol dimethacrylate, pentaerythritol dimethacrylate, pentaerythritol trimethacrylate, dipentaerythritol dimethacrylate, dipentaerythritol tetramethacrylate, pentaerythritol octamethacrylate, ethylene glycol dimethacrylate, 1,3-butanediol dimethacrylate, sorbitol tetramethacrylate, ethylene glycol diitaconate, propylene glycol diitaconate, 1,3-butanediol diitaconate, 1,4-butanediol diitaconate, tetramethylene glycol diitaconate, pentaerythritol diitaconate, dipentaerythritol triitaconate, dipentaerythritol pentaitaconate, dipentaerythritol hexaitaconate, sorbitol tetraitaconate, ethylene glycol dicrotonate, propylene glycol dicrotonate, tetramethylene glycol dicrotonate, pentaerythritol dicrotonate, sorbitol tetracrotonate, ethylene glycol diisocrotonate, pentaerythritol diisocrotonate, sorbitol tetraisocrotonate, ethylene glycol dimaleate, triethylene glycol dimaleate, pentaerythritol dimaleate, sorbitol tetramaleate, modified tetramethylene glycol diacrylate, modified trimethylol propane triacrylate, modified pentaerythritol triacrylate, methacrylated epoxy resin, and mixtures of the foregoing esters.

5. The photopolymerizable composition claimed in claim 1, wherein the substituent group of the phenyl group of the acridine compound is selected from the group consisting of a substituted or unsubstituted alkyl group having 1 to 5 carbon atoms, a substituted or unsubstituted alkoxyl group having 1 to 5 carbon atoms, an acyl group having 1 to 5 carbon atoms, a dialkylamino group, both alkyl groups having 1 to 5 carbon atoms, a cyano group and a halogen atom.

6. The photopolymerizable composition claimed in claim 4, wherein said acridine compound is selected from the group consisting of 9-phenylacridine, 9-(p-methylphenyl)acrydine, 9-(p-ethylphenyl)acridine, 9-(p-n-propylphenyl)acridine, 9-(p-isopropylphenyl)acridine, 9-(p-n-butylphenyl)acridine, 9-(p-tert-butylphenyl)acridine, 9-(p-methoxyphenyl)acridine, 9-(p-ethoxyphenyl)acridine, 9-(p-acetylphenyl)acridine, 9-(p-dimethylaminophenyl)acridine, 9-(p-diethylaminophenyl)acridine, 9-(p-cyanophenyl)acridine, 9-chlorophenyl)acridine, 9-(p-bromophenyl)acridine, 9-(m-methylphenyl)acridine, 9-(m-ethylphenyl)acridine, 9-(m-n-propylphenyl)acridine, 9- (m-isopropylphenyl)acridine, 9-(m-n-butylphenyl)acridine, 9-(m-tert-butylphenyl)acridine, 9-(m-methoxyphenyl)acridine, 9-(m-ethoxyphenyl)acridine, 9-(m-acetylphenyl)acridine, 9-(m-dimethylaminophenyl)acridine, 9-(m-diethylaminophenyl)acridine, 9-(m-cyanophenyl)acridine,9-(m-chlorophenyl)acridine, and 9-(m-bromophenyl)acridine.

7. The photopolymerizable composition claimed in claim 1, wherein said heterocyclic thiol compound is selected from the group consisting of 2-mercaptoimidazole, 2-mercaptooxazole, 2-mercaptothiazole, 3-mercapto-1,2,4-triazole, 2-mercaptobenzimidazole, 2-mercaptobenzoxazole, 2-mercaptobenzothiazole, 2-mercaptooxadiazole, 5-methylmercapto-2-mercaptooxadiazole, 5-methylmercapto-2- mercaptothiazole, 5-mercapto-1-phenyltetrazole, 6-chloro-2-mercaptobenzimidazole, 6-chloro-2-mercaptobenzothiazole, 6-methoxy-2-mercaptobenzimidazole, 6-methoxy-2-mercapto benzoxazole, 6-methoxy-2-mercaptobenzothiazole, 6-phenyl-2-mercaptobenzimidazole, 6-phenyl-2-mercaptobenzoxazole, 6-phenyl-2-mercaptobenzothiazole, 2-mercaptonaphthoimidazole, 2-mercaptonaphthoxazole, and 2-mercaptonaphthothiazole.

8. The photopolymerizable composition claimed in claim 5, wherein said heterocyclic thiol compound is selected from the group consisting of 2-mercaptoimidazole, 2-mercaptooxazole, 2-mercaptothiazole, 3-mercapto-1,2,4- triazole, 2-mercaptobenzimidazole, 2-mercaptobenzoxazole, 2-mercaptobenzothiazole, 2-mercaptooxadiazole, 5-methylmercapto-2-mercaptooxadiazole, 5-methylmercapto-2mercaptothiazole, 5-mercapto-1-phenyltetrazole, 6-chloro-2-mercaptobenzimidazole, 6-chloro-2-mercaptobenzothiazole, 6-methoxy-2-mercaptobenzimidazole, 6-methoxy-2-mercaptobenzoxazole, 6-methoxy-2-mercaptobenzothiazole, 6-phenyl-2-mercaptobenzimidazole, 6-phenyl-2-mercaptobenzoxazole, 6-phenyl-2-mercaptobenzothiazole, 2-mercaptonaphthoimidazole, 2-mercaptonaphthoxazole, and 2-mercaptonaphthothiazole.

9. The photopolymerizable composition claimed in claim 6, wherein said heterocyclic thiol compound is selected from the group consisting of 2-mercaptoimidazole, 2-mercaptooxazole, 2-mercaptothiazole, 3-mercapto-1,2,4-triazole, 2-mercaptobenzimidazole, 2-mercaptobenzoxazole, 2-mercaptobenzothiazole, 2-mercaptooxadiazole, 5-methylmercapto-2-mercaptooxadiazole, 5-methylmercapto-2mercaptothiazole, 5-mercapto-1-phenyltetrazole, 6-chloro-2-mercaptobenzimidazole, 6-chloro-2-mercaptobenzothiazole, 6-methoxy-2-mercaptobenzimidazole, 6-methoxy-2-mercaptobenzoxazole, 6-methoxy-2-mercaptobenzothiazole, 6-phenyl-2-mercaptobenzimidazole, 6-phenyl-2-mercaptobenzoxazole, 6-phenyl-2-mercaptobenzothiazole, 2-mercaptonaphthoimidazole, 2-mercaptonaphthoxazole, and 2-mercapto- naphthothiazole.

10. The photopolymerizable composition claimed in claim 5, wherein said heterocyclic thiol compound is selected from the group consisting of 2-mercaptobenzimidazole, 2-mercaptobenzoxazole, 2-mercaptobenzothiazole, 3-mercapto-1,2,4-triazole, and 5-mercapto-1-phenyltetrazole.

11. The photopolymerizable composition claimed in claim 6, wherein said heterocyclic thiol compound is selected from the group consisting of 2-mercaptobenzimidazole, 2-mercaptobenzoxazole, 2-mercaptobenzothiazole, 3-mercapto-1,2,4-triazole, and 5-mercapto-1-phenyltetrazole.

12. The photopolymerizable composition claimed in claim 1, wherein said photopolymerization initiator is present in an amount of 1:10 to 1:100 parts by weight to said polymerizable compound having at least one ethylenic unsaturated double bond.

13. The photopolymerizable composition claimed in claim 1, wherein the weight ratio of said acridine compound to said hetercyclic thiol compound is from about 10:1 to 1:10.

* * * * *